(12) United States Patent
Murphy

(10) Patent No.: US 6,812,696 B2
(45) Date of Patent: Nov. 2, 2004

(54) APPARATUS AND METHODS USING MECHANICAL RESONATORS TO ENHANCE SENSITIVITY IN LORENTZ FORCE MAGNETOMETERS

(75) Inventor: John C. Murphy, Clarksville, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 09/813,767

(22) Filed: Mar. 21, 2001

(65) Prior Publication Data

US 2001/0035750 A1 Nov. 1, 2001

Related U.S. Application Data

(60) Provisional application No. 60/191,065, filed on Mar. 21, 2000.

(51) Int. Cl.$^7$ ................................................ G01R 33/00
(52) U.S. Cl. ..................................... 324/260; 324/244.1
(58) Field of Search ................................ 324/244, 249, 324/256, 257, 259, 260

(56) References Cited

U.S. PATENT DOCUMENTS

| | | | | |
|---|---|---|---|---|
| 4,160,401 A | * | 7/1979 | Tomioka | |
| 4,348,587 A | * | 9/1982 | Tangonan et al. | 250/227.14 |
| 4,471,219 A | * | 9/1984 | Giallorenzi | 250/227.14 |
| 4,675,522 A | * | 6/1987 | Arunkumar | 324/244 X |
| 5,009,142 A | * | 4/1991 | Kurtz | |
| 5,959,452 A | * | 9/1999 | Givens et al. | 324/260 |
| 6,275,034 B1 | * | 8/2001 | Tran et al. | 324/259 X |
| 6,348,788 B1 | * | 2/2002 | Yao et al. | 324/259 X |

FOREIGN PATENT DOCUMENTS

JP 64-35284 * 2/1989

\* cited by examiner

*Primary Examiner*—Anjan Deb
*Assistant Examiner*—Reena Aurora
(74) *Attorney, Agent, or Firm*—Francis A. Cooch

(57) ABSTRACT

A Lorentz Force magnetometer based on a mechanical resonator including a resonant, vibrating electrically conducting string or insulating fiber coated with an electrically conducting material and its response to a Lorentz Force wherein the string or fiber, fixed at two ends, is tensioned over two frets (supports) separated by a distance, L, hence, becoming mechanically resonant with high Q. The frets constrain the position of the string or fiber but not the angle it makes with the fret, thus, permitting measurement of multiple vector magnetic fields. The magnetometer can be easily manufactured in arrays with the tension and, hence, resonant frequency for each magnetometer being rapidly, sequentially, and dynamically varied through the use of, e.g., piezo/MEMS elements. If the fiber is light conducting, a compact and sensitive detector using light escaping from an aperature in the conducting material coating the fiber can be implemented.

12 Claims, 2 Drawing Sheets

APPARATUS AND METHODS USING MECHANICAL RESONATORS TO ENHANCE SENSITIVITY IN LORENTZ FORCE MAGNETOMETERS

CROSS-REFERENCE TO RELATED APPLICATIONS

The present application claims the benefit of earlier filed, copending U.S. provisional application No. 60/191,065, filed Mar. 21, 2000, which is incorporated herein by reference.

BACKGROUND OF THE INVENTION

1. Field of the Invention

The invention relates to Lorentz Force magnetometers or magnetic field sensors that use mechanical resonators to enhance sensitivity including a simple, small, lightweight, low-cost, and low-power-consumption sensor that utilizes a resonant string and the Lorentz Force to measure multiple vector magnetic fields.

2. Description of the Related Art

There is increasing interest in the development of miniature magnetometers for mapping magnetic fields found in space, industrial, environmental, and biomedical applications. The trend is constantly toward smaller size, lower power consumption, and lower cost for similar performance. Toward this end, recent developments have included the use of piezoresistive cantilevers (originally developed for atomic force and scanning tunneling microscopy) and $\mu$ magnetometers (based on electron tunneling effects).

The problem with the above devices is that they require, at least in some stages of their assembly, extensive and intricate processing. Furthermore, their sensitivities, defined as the minimum detectable field change, are generally in the range of 1 $\mu$T to 1 $\mu$T. Therefore, there remains a need for magnetometers with increased sensitivity in which size, power and cost are reduced.

Devices such as the pendulum clock or, more recently, quartz crystal resonator controlled watches use mechanical resonators to enhance detection. In both examples, the accuracy is directly linked to the quality factor or "Q" of the resonator.

A new type of mechanical resonator magnetometer based on excitation of a resonant bar configured in a xylophone geometry with supports at the nodes of the first transverse node is described in U.S. Pat. No. 5,959,452, issued Sep. 28, 1999, by Givens et al which is incorporated herein by reference. The xylophone magnetometer measures the vectorial component of the magnetic field which lies in the plane of the xylophone and is perpendicular to its major axis.

The response of the xylophone magnetometer was linear to a low frequency magnetic field over 7 decades of range and had a noise floor below 1 nanotesla. The high sensitivity of this sensor was based in part on the high resonant $0(\approx10,000)$ of the xylophone resonator ($0=f_0/\Delta f$ where $f_0$ is the resonance frequency and $\Delta f$ is the full width at half maximum of the resonance response).

While the xylophone magnetometer was a significant improvement, there remains a need for a magnetometer that can measure multiple vector magnetic fields and whose resonant frequency can be easily and dynamically varied. Ease of manufacture particularly in arrays for use in biomedical applications, particularly in catheters, is another goal.

SUMMARY OF THE INVENTION

The invention, a new type of mechanical resonator magnetometer utilizing a resonant string and based on the response to a Lorentz Force, is a significant improvement over the xylophone magnetometer disclosed in U.S. Pat. No. 5,959,452. The invention can measure multiple vector magnetic fields, can rapidly change resonant frequency and can be easily manufactured in arrays. All of these new features allow the invention to be useful in certain application areas including medical applications as discussed below.

The mechanical resonator magnetometer of the invention comprises an electrically conducting string or an insulating fiber coated with an electrically conducting material wherein the fiber may be light conducting, and means for supporting the string or fiber in tension at two locations. When a current is inserted in the string or fiber and the magnetometer placed in a magnetic field, the resulting Lorentz Force will cause the string or fiber to deflect along multiple axes that can be detected. Tension of the string or fiber can be varied using, e.g., piezo or MEMS elements. Detection of the light conducting fiber embodiment of the invention with high sensitivity and in a compact manner may be had by forming an aperture in the electrically conducting material coating the fiber and detecting the emitted light.

In the vibrating string magnetometer of the invention, the resonant structure is the string itself. Familiar devices based on the resonant string are such musical instruments as the violin and guitar. For these devices the resonant frequency is determined by the string mass per unit length, string length and tension applied to the string. The quality factor is more difficult to determine but is broadly related to energy losses due to internal friction, to the string supports, and to the air.

An important issue in maintaining a high quality factor is keeping losses low. This directly relates to the issue of detection of the motion of a string which carries a current in the presence of a perpendicular magnetic field. The Lorentz Force is given by $F_L=J\times B$ where J is the vector current and B the vector magnetic field. If the direction of the string is along the y-direction, then $J=J_y$ and the interacting fields, $B_z$ and $B_x$, produce forces (and motion) along the x and z axes respectively. By measurement of the motions, it is possible to measure the magnetic fields $B_z$ and $B_x$ simultaneously.

DETAILED DESCRIPTION OF THE INVENTION

The magnetometer of the invention is based on a resonant vibrating string. The string magnetometer extends the xylophone magnetometer of U.S. Pat. No. 5,959,452 which is itself a special case of a Lorentz Force magnetometer that uses a mechanical resonator to enhance signal-to-noise ratio (SNR).

Figure 1:
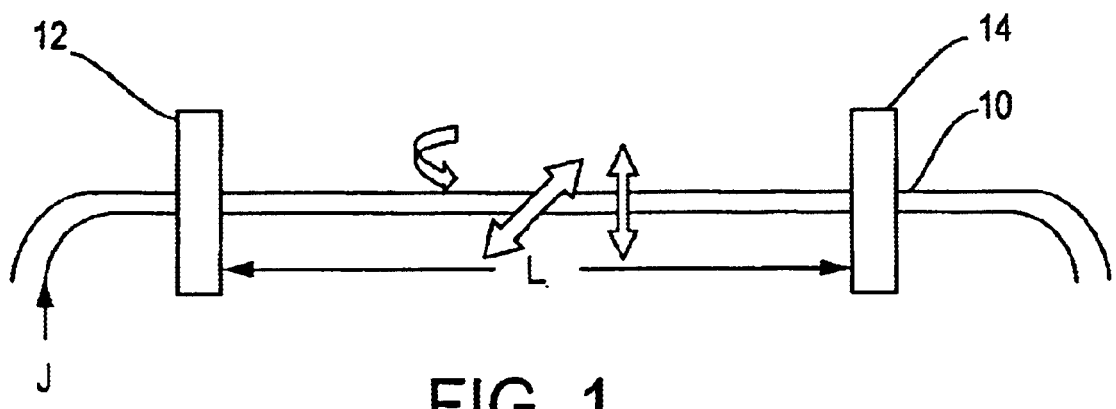
FIG. 1 illustrates a schematic of the mechanical structure of the resonant string magnetometer of the invention.

As shown in FIG. 1, the mechanical resonator or structure on which the magnetometer of the invention is based is the string 10. When the string with fixed ends is stretched over two frets (supports) 12, 14, separated by a distance, L, the string segment between the frets becomes mechanically resonant with high Q. The frets constrain the position of the string with free slope, i.e., the angle the string makes with the fret is not constrained.

Figure 2:
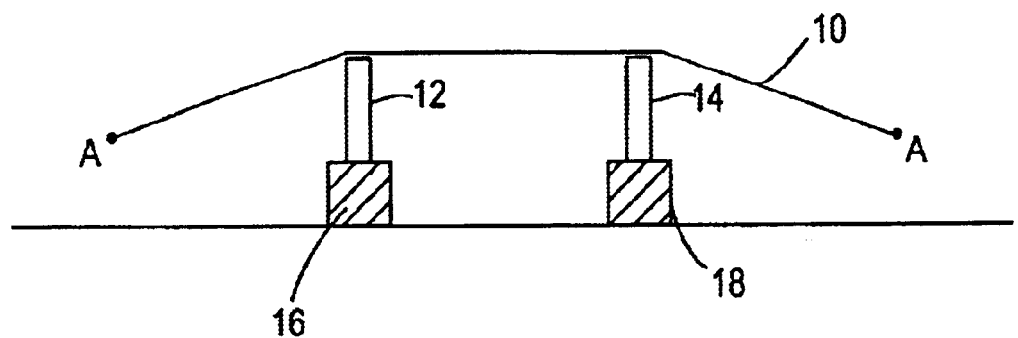
FIG. 2 illustrates an embodiment that uses piezo elements to change the string tension and, hence, the resonant frequency of the magnetometer.
Figure 3:
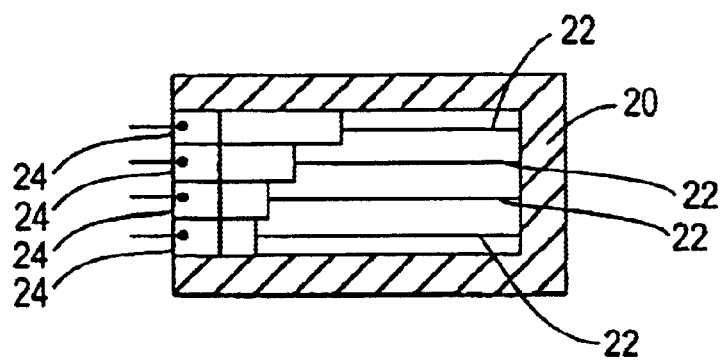
FIG. 3 illustrates a MEMS embodiment of the invention for changing string tension and, hence, the resonant frequency of the magnetometer.

The position of the frets can be changed to adjust the tension and, hence, the resonant frequency of the string. Tensioning can be done rapidly by piezo or microelectromechanical (MEMS) elements. An example is shown in FIG. 2, where piezo elements 16, 18 support frets 12, 14 over which string 10 is stretched and fixed at points, A. A voltage can then be applied to the piezo elements causing them to expand and push upward on the frets thereby increasing the tension in the string. An alternative is to attach the string directly to the frets and to vary the distance between the frets. FIG. 3 illustrates another option which uses a MEMS fabricated device on a silicon substrate 20 on which different length strings 22 are placed such that the resonant frequency can be changed by selecting the appropriate string through electrical contacts 24.

While a large number of resonances can be excited in a single string, the lowest resonance of a simple string is at a frequency of $f_0=(T/\rho)^{0.5}/2L$ where L is the distance between frets, $\rho$ is the mass density of the string and T is the tension applied to the string. In an instrument such as a guitar or violin the device is tuned by changing the string tension T. The ability to vary the resonant frequency of the mechanical element, i.e., the string, parametrically is one of the features that distinguishes the invention from the xylophone magnetometer of U.S. Pat. No. 5,959,452. This ability has potentially important applications some of which are described below.

If the string is a conducting wire or an insulating fiber covered with a metal or other electrically conducting material then a sinusoidal current J can be passed along the string. This current will interact with a vectorial magnetic field perpendicular to the string axis to produce a Lorentz Force whose direction is perpendicular to the plane containing the string and the magnetic field. This force will cause motions of the string at the frequency of the current for the case of a steady magnetic field, i.e., $f_{mf}=0$ Hz, or more generally at $f_{string}=f_{current}\pm f_{mf}$ where $f_{string}$ and $f_{mf}$ are the string and magnetic field frequencies respectively. When $f_{string}=f_0$, i.e. the fundamental resonance of the string, then the response greatly increases and the minimum detectable magnetic field decreases.

Another feature of the invention which distinguishes it from the xylophone device is that the string can vibrate in any direction orthogonal to its axis, hence, the magnetic field can also have any orientation in the orthogonal plane. From a vibration point of view this is a "degenerate" case where two independent, orthogonal directions or modes of vibration exist.

For the pure degenerate case with no preferred direction of vibration set by the structure all vibration directions are equivalent. For example, in a guitar, one direction could be perpendicular to the face of the guitar body and the other parallel to the face of the guitar body both with the same frequency and Q. For a real guitar this degeneracy is broken by the fret geometry and two related and often closely spaced resonant modes are seen usually in the configuration normal and parallel to the instrument face. In general, the directions of motion of the string can be controlled and each mode can be excited by a force along its direction of motion which for the magnetometer is the Lorentz Force.

For the resonant string magnetometer of the invention, the excitation is produced by the Lorentz Force which is controlled by a magnetic field perpendicular to the string axis and orthogonal to the direction of motion. For specificity, imagine a right hand coordinate system with the string axis lying along the y-axis in space and the x and z axes lying parallel to the horizontal and vertical axes of motion, respectively. Then a magnetic field along the x-axis will excite a z-axis (vertical) motion and a magnetic field along the z-axis will excite a x-axis (horizontal) motion. As a result, a single string can detect two orthogonal components of the external magnetic field simultaneously.

The string magnetometer of the invention is well suited for a wide variety of low-cost, compact applications where magnetometers are required. In particular, the invention can be incorporated into catheters for cardiac catheterization and other biomedical applications. Both single sensor, two magnetic field axis devices and a catheter-based linear, multi-sensor array have been developed.

The use of these catheter magnetic fields sensors in heart catheterization for cardiac ablation will be extremely useful. In cardiac ablation, aberrant current pathways on the heart which cause extra beats and sometimes severe arrhythmia's are removed by electrical destruction of selected regions of the heart tissue. An important aspect of this procedure is determining the precise location of the region to be destroyed and then assessing the degree of success of the destruction. Current practice requires a long operation which successively induces heart fibrillation followed by ablation, followed by another induction of fibrillation. If a sensor were available to monitor the local current distributions on the heart at the positions of the ablating catheter, it would be possible to locate the aberrant current paths directly to guide the ablation and, hence, to improve the treatment process.

The resonant string magnetometer of the invention has the requisite capabilities. Assuming that the catheter approaches the heart with the catheter axis perpendicular to the heart surface, the two field directions and the current elements which produce them lie in the plane of the heart perpendicular to the string direction. This means that the direction and magnitude of local surface currents on the heart at the position of the catheter can be measured. The re-entrant loops and other anomalous current paths which produce arrhythmia's can then be detected. The sensitivity of the string magnetometer will be adequate if the device has a detection threshold similar to that of the xylophone magnetometer.

In addition, another embodiment consists of a linear array consisting of several magnetometers of the invention along a single axis inside a single catheter wherein the portion of the string or fiber connecting each magnetometer is not in tension in order to minimize mechanical coupling between magnetometers. In this case, second and higher order magnetic field gradients can be determined with significant improvements in spatial resolution and in rejection of distant sources of magnetic noise such as those found in an operating room environment.

In a second biomedical application, the magnitude and direction of biological currents in the heart can be detected from outside the body via the magnetic fields the currents produce. Such detection has been demonstrated previously using SQUID (Superconducting Interference Detectors). However these sensors operate at liquid helium temperatures and require complex support facilities. Arrays of string magnetometers of the invention have the potential of being able to monitor vector currents on the heart at comparable resolution but at much lower cost.

A third biomedical application allows biological currents in the brain to be detected via the magnetic fields these currents produce. The currents can be those produced by the brain during normal activity or by the evoked response to light flashes or other sensor stimulation. The difficulties involved are the ability to measure the very small magnetic fields produced by the brain currents (significantly smaller than in the case of the heart) and the ability to determine the position and depth of these currents including being able to identify a local current of interest from the general background fields generated by other brain currents. In this respect, the high sensitivity, small size of individual sensors in a string/fiber based array and the ability to bring the sensor close to the skull are potential key advantages since spatial resolution is determined by the smaller of the sensor size and the distance between sensor and current element being measured. Hence a small, sensitive detector able to be placed close to the skull is important.

A second advantage of the string/fiber sensor geometry of the invention is the ability to configure a linear array of sensors in a catheter-like geometry as discussed above. For the heart and brain applications the catheter "chain" can be replicated into a series of parallel chains separated by a distance, d. The result is a flexible net of sensors, for the brain a "helmet" of magnetometers which can conform closely to the skull. Since the flexible net conforms closely to the skull and has a known spacing between elements, it may be possible to use numerical methods to "backproject" the sensor array data to improve spatial resolution of local current distributions within the brain. The important factors are the dimension of an individual sensor, the intersensor spacing and the distance from sensor to current element i.e. small element size, close spacing and a close fit to the head. If the two-dimensional array is placed on the surface of the chest or elsewhere on the body, such a device could be used to analyze the heart and other organs as well. Additionally, a multilayer array or net would permit vertical gradient detection.

The string/fiber arrays, both linear and two-dimensional as discussed above, have even greater capability when the tension and, hence, the frequency of each magnetometer can be varied sequentially, independently and dynamically (assuming the same string/fiber throughout the array) using, e.g., piezo elements as discussed above. This permits array processing and even use of the array as a swept frequency analyzer. Frequency diversity will also minimize crosstalk between magnetometers.

A method for detecting string motions with high sensitivity, along both y and z axes in a compact manner suitable for use as part of an array detection embodiment of the invention will now be described.

Figure 4:
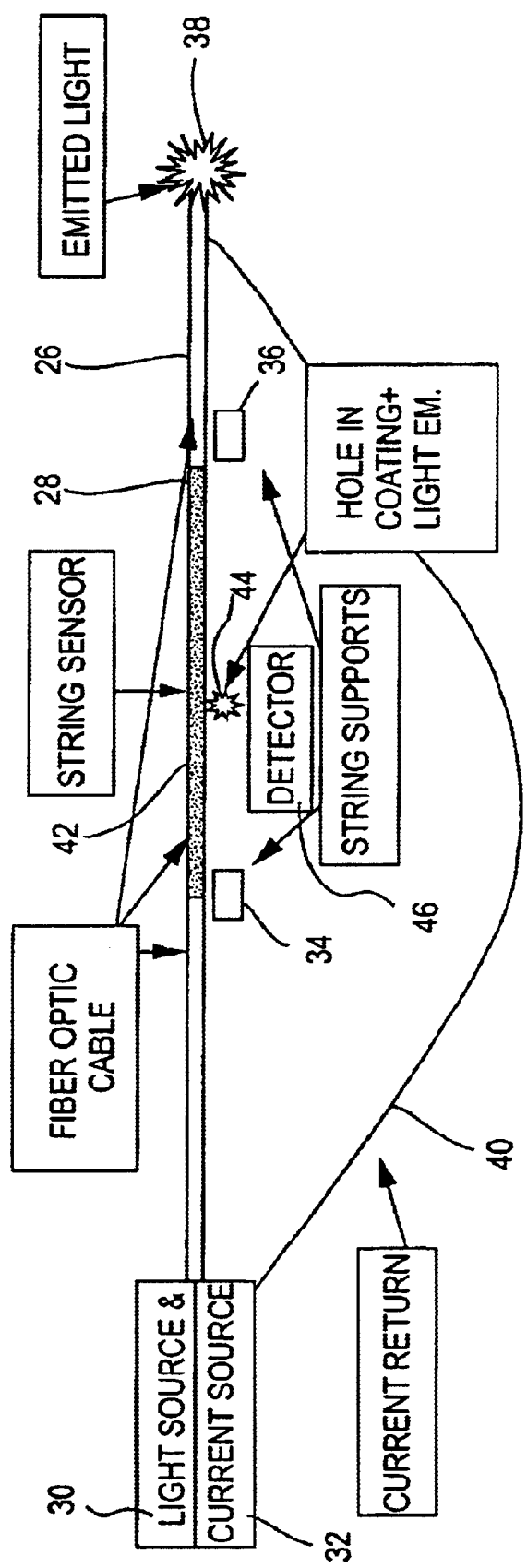
FIG. 4 illustrates a detection method embodiment of the invention.

First, as shown in FIG. 4, assume the string is a single mode optical fiber 26 coated with a thin conducting layer such as a gold thin film 28. This layer serves as a conduit for the applied current and helps confine light inserted into the fiber at its proximal end near the source. FIG. 4 illustrates one possible embodiment which shows light from a light source 30 and current from a current source 32 inserted into the fiber, current passing on the coating on the exterior of the fiber, and the central section of the fiber supported by supports 34, 36 and tensioned for use as a sensor as described above. Emitted light 38 and a current return 40 are also shown.

The new detection method is to use the light passing through the fiber for detection and not to apply any exterior light for beam deflection detection or to use piezoelectric or other detection means. The use of light detection minimizes loss of mechanical energy to the contacts, and simplifies and minimizes the size of the detection system. There are three distinct embodiments:

An opening/aperture 42 in the conducting layer coating the fiber is created in the active sensor region. Light 44 escapes through the opening and is then detected using a detector 46 such as a position sensitive lateral cell optical detector, a quad or bi-cell optical detector or a CCD array. In the last case, differences in the response of adjacent pixels are captured to measure temporal variations in the optical intensity gradient of light escaping the fiber. The motion of this intensity profile is a measure of the motion of the fiber and thereby a measure of the magnetic field. This facilitates magnetometer sensor detection since all functional elements are placed in a planar system with no additional external source required. If magnetometer arrays are used to map the distribution of the magnetic field and the distribution of the magnetic field gradient, such measures can be aided by this detection approach.

A further embodiment enhances the opening/aperture in the conducting layer coating the fiber method by creating a defect in the fiber surface (via a scratch for example) or a scattering center within the fiber (e.g., $TiO_2$ particles dispersed inside the fiber) to increase the scattered amplitude and, hence, improve detection SNR.

A final embodiment is to use two apertures/openings in orthogonal positions on the fiber for simultaneous measurement of two orthogonal vector components of the motions or equivalently two magnetic field components. This aids in mapping of the vector components of the magnetic field.

I claim:

1. A magnetometer comprising:

a silicon substrate;

a plurality of electrically conducting strings of varying lengths, each string being placed on the substrate and being capable of receiving a current;

means for supporting each string in tension at two locations on the substrate, the string being capable of vibrating in any direction orthogonal to its axis;

the magnetometer being placed in a magnetic field to be detected, the magnetic field being perpendicular to the direction of the current and producing a Lorentz Force perpendicular to the string, the Lorentz Force causing deflection in the string along multiple axes that can be detected, the current being switchable between the strings to change the resonant frequency of the magnetometer and thereby the magnetic field that can be detected.

2. A magnetometer array comprising a plurality of magnetometers, each magnetometer comprising:

a silicon substrate;

a plurality of electrically conducting strings of varying lengths, each string being placed on the substrate and being capable of receiving a current;

means for supporting each string in tension at two locations on the substrate, the string being capable of vibrating in any direction orthogonal to its axis;

the magnetometer being placed in a magnetic field to be detected, the magnetic field being perpendicular to the direction of the current and producing a Lorentz Force perpendicular to the string, the Lorentz Force causing deflection in the string along multiple axes that can be detected, the current being switchable between the strings to change the resonant frequency of the magnetometer and thereby the magnetic field that can be detected;

wherein the magnetometers are joined end to end with the portion of the string connecting two magnetometers not in tension.

3. The magnetometer array as recited in claim 2, wherein each of the plurality of electrically conducting strings comprises an insulating fiber coated with an electrically conducting material.

4. The magnetometer of claim 3, further comprising a light source for inserting light into the fiber, wherein the fiber is light conducting.

5. A magnetometer comprising:
   an electrically conducting string comprising an insulating fiber coated with an electrically conducting material, the string receiving a current;
   means for supporting the string in tension at two locations, the string being capable of vibrating in any direction orthogonal to its axis;
   a light source for inserting light into the fiber, wherein the fiber is light conducting; and
   means for detecting the deflection in the fiber, the means for detecting comprising:
      a first aperture in the conducting material on the fiber; and
      a detector for detecting light escaping through the aperture;
   the magnetometer being placed in a magnetic field to be detected, the magnetic field being perpendicular to the direction of the current and producing a Lorentz Force perpendicular to the string, the Lorentz Force causing deflection in the string along multiple axes that can be detected.

6. The magnetometer as recited in claim 5, wherein the detector comprises a position sensitive lateral cell optical detector.

7. The magnetometer as recited in claim 5, wherein the detector comprises a multi-cell optical detector.

8. The magnetometer as recited in claim 5, wherein the detector comprises a CCD detector.

9. The magnetometer as recited in claim 5, further comprising a defect in the fiber surface for increasing scattered amplitude and, hence, signal-to-noise ratio.

10. The magnetometer as recited in claim 5, further comprising a scattering means in the center of the fiber for increasing scattered amplitude and, hence, signal-to-noise ratio.

11. The magnetometer as recited in claim 5, further comprising a second aperture in the conducting material on the fiber, the second aperture being orthogonal to the first aperture for simultaneous measurement of two orthogonal vector components of the motion of the fiber and, hence, two magnetic field components.

12. A method for detecting multiple vector magnetic fields comprising the steps of:
   supporting a light conducting fiber coated with an electrically conducting material in tension at two locations, the fiber being capable of vibrating in any direction orthogonal to its axis;
   forming an aperture in the conducting material on the fiber;
   inserting a current and light at one end of the fiber and extracting the current and light at the other end;
   placing the fiber in a magnetic field perpendicular to the direction of the current in the fiber, there by producing a Lorentz Force perpendicular to the fiber, the Lorentz Force causing deflection in the fiber;
   varying the tension of the fiber;
   detecting the light escaping through the aperture; and
   detecting the deflection in the fiber along multiple axes.

* * * * *